United States Patent
Yen et al.

(10) Patent No.: US 10,497,426 B1
(45) Date of Patent: Dec. 3, 2019

(54) TARGET ROW GENERATOR, DRAM, AND METHOD FOR DETERMINING A TARGET ROW

(71) Applicant: NANYA TECHNOLOGY CORPORATION, New Taipei (TW)

(72) Inventors: Nung Yen, Taoyuan (TW); Po-Hsun Chang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/138,044

(22) Filed: Sep. 21, 2018

(51) Int. Cl.
*G11C 8/14* (2006.01)
*G11C 11/408* (2006.01)

(52) U.S. Cl.
CPC ........... *G11C 11/4087* (2013.01); *G11C 8/14* (2013.01)

(58) Field of Classification Search
CPC .............................. G11C 8/14; G11C 11/4087
USPC .............................................. 365/230.06, 200
See application file for complete search history.

(56) References Cited

U.S. PATENT DOCUMENTS 5,680,362 A * 10/1997 Parris ..................... G11C 8/12
365/230.01

OTHER PUBLICATIONS

Office Action dated Jul. 31, 2019 in TW Application No. 107140180.
"Internet of Things," https://nmart.pixnet.net/blog/post/47288034; Jul. 30, 2019.

* cited by examiner

*Primary Examiner* — Son L Mai
(74) *Attorney, Agent, or Firm* — Muncy, Geissler, Olds & Lowe, P.C.

(57) ABSTRACT

The present disclosure provides a target row generator. The target row generator includes a plurality of counting modules, a comparing module and a first processing module. Each of the plurality of counting modules is configured to generate a counting record, and includes a reset timer. The reset timer is configured to generate a reset signal to reset a corresponding one of the plurality of counting modules. The comparing module is connected to the plurality of counting modules and is configured to compare a plurality of counting records generated by the plurality of counting modules. The first processing module is connected to the comparing module and is configured to generate a target row record based on a comparison result from the comparing module. The quantity of the plurality of counting records is less than the quantity of the plurality of stressed rows.

20 Claims, 17 Drawing Sheets

US 10,497,426 B1

TARGET ROW GENERATOR, DRAM, AND METHOD FOR DETERMINING A TARGET ROW

TECHNICAL FIELD

The present disclosure relates to a circuit, a dynamic random access memory (DRAM) and a method, and more particularly, to a target row generator, a DRAM and a method for determining a target row.

DISCUSSION OF THE BACKGROUND

A DRAM usually has high cell density, and row hammer problems are frequently incurred. When a row of the DRAM is repeatedly activated, charges of the row may leak and interact electrically with an adjacent row, causing the adjacent row, which is not desired to be activated, to experience a bit flipping phenomenon.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a target row generator. The target row generator comprises a plurality of counting modules, a comparing module and a first processing module. Each of the plurality of counting modules is configured to generate a counting record. The comparing module is connected to the plurality of counting modules and is configured to compare a plurality of counting records generated by the plurality of counting modules. The first processing module is connected to the comparing module and is configured to generate a target row record based on a comparison result from the comparing module. In some embodiments, each of the plurality of counting records represents a stressed degree of a corresponding one of a plurality of stressed rows. In some embodiments, the quantity of the plurality of counting modules is less than the quantity of the plurality of stressed rows.

In some embodiments, each of the plurality of counting modules is configured to record a stressed degree of one of a plurality of rows, and the counting record of each of the plurality of counting modules is generated based on the stressed degree of a corresponding one of the plurality of rows.

In some embodiments, each of the plurality of counting modules includes a gate, an address storage unit and a counter. The gate is configured to allow passage of a stressed row address of the corresponding one of the plurality of rows. The address storage unit is connected to the gate and is configured to store the stressed row address of the corresponding one of the plurality of rows. The counter is connected between the address storage unit and the comparing module, and the counter is configured to record the stressed degree of the corresponding one of the plurality of rows, and to generate the counting record.

In some embodiments, each of the plurality of counting modules further includes a reset timer connected to the gate, the address storage unit and the counter, wherein the reset timer is configured to generate a reset signal to reset the gate, the address storage unit, the counter and the reset timer itself.

In some embodiments, the target row generator further comprises an enabling module connected to the plurality of counting modules and configured to generate an enable signal.

In some embodiments, the target row generator further comprises a second processing module connected to the first processing module, the enabling module and the plurality of counting modules, wherein the second processing module is configured to generate a reset signal to reset one of the plurality of counting modules.

Another aspect of the present disclosure provides a dynamic random access memory (DRAM). The DRAM comprises a memory array including a plurality of banks and a row-determining circuit, wherein the row-determining circuit is connected to the memory array. Each of the plurality of banks includes a plurality of rows. In some embodiments, the row-determining circuit includes a target row generator configured to generate a target row record, and the target row generator includes a plurality of counting modules, a comparing module and a first processing module. Each of the plurality of counting modules is configured to generate a counting record. The comparing module is connected to the plurality of counting modules and is configured to compare a plurality of counting records generated by the plurality of counting modules. The first processing module is connected to the comparing module and is configured to generate the target row record based on a comparison result from the comparing module, in some embodiments, each of the plurality of counting records represents a stressed degree of a corresponding one of a plurality of stressed rows. In some embodiments, the quantity of the plurality of counting modules is less than the quantity of the plurality of stressed rows.

In some embodiments, each of the plurality of counting modules is configured to record a stressed degree of one of the plurality of rows, and the counting record of each of the plurality of counting to modules is generated based on the stressed degree of a corresponding one of the plurality of rows.

In some embodiments, each of the plurality of counting modules includes a gate, an address storage unit and a counter. The gate is configured to allow passage of a stressed row address of the corresponding one of the plurality of rows. The address storage unit is connected to the gate and is configured to store the stressed row address of the corresponding one of the plurality of rows. The counter is connected between the address storage unit and the comparing module, and the counter is configured to record the stressed degree of the corresponding one of the plurality of rows and to generate the counting record.

In some embodiments, each of the plurality of counting modules further includes a reset timer connected to the gate, the address storage unit and the counter, wherein the reset timer is configured to generate a reset signal to reset the gate, the address storage unit, the counter and the reset timer itself.

In some embodiments, the target row generator further includes an enabling module connected to the plurality of counting modules and configured to generate an enable signal.

In some embodiments, the target row generator further includes a second processing module connected to the first processing module, the enabling module and the plurality of counting modules, wherein the second processing module is configured to generate a reset signal to reset one of the plurality of counting modules.

In some embodiments, the DRAM further comprises a command decoder connected to the plurality of counting modules and configured to generate an active command and the stressed row address for each of the plurality of counting modules.

In some embodiments, the command decoder is connected to the gate of each of the plurality of counting modules.

In some embodiments, the row-determining circuit further includes a row address multiplexer connected to the first processing module of the target row generator and configured to generate a row address record.

Another aspect of the present disclosure provides a method for determining a target row. The method comprises the following steps. A plurality of counting records are generated, wherein each of the plurality of counting records represents a stressed degree of a corresponding one of a plurality of stressed rows, and the quantity of the plurality of counting records is less than the quantity of the plurality of stressed rows. The plurality of counting records are compared based on the stressed degree to generate a comparison result. A target row record is generated based on the comparison result.

In some embodiments, the method further comprises a step of removing one of the plurality of counting records, wherein the removed one of the plurality of counting records has a lower stressed degree.

In some embodiments, the step of removing one of the plurality of counting records is performed if the number of the plurality of counting records is equal to a reference number.

In some embodiments, the method further comprises a step of removing one of the plurality of counting records, wherein the removed one of the plurality of counting records remains zero during a preset period of time.

In some embodiments, the step of removing one of the plurality of counting records is performed if the number of the plurality of counting records is equal to a reference number.

With the above-mentioned configurations of the target row generator, space occupied by the plurality of counters in the DRAM is reduced. Consequently, the disadvantages of a conventional target row generator can be alleviated.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
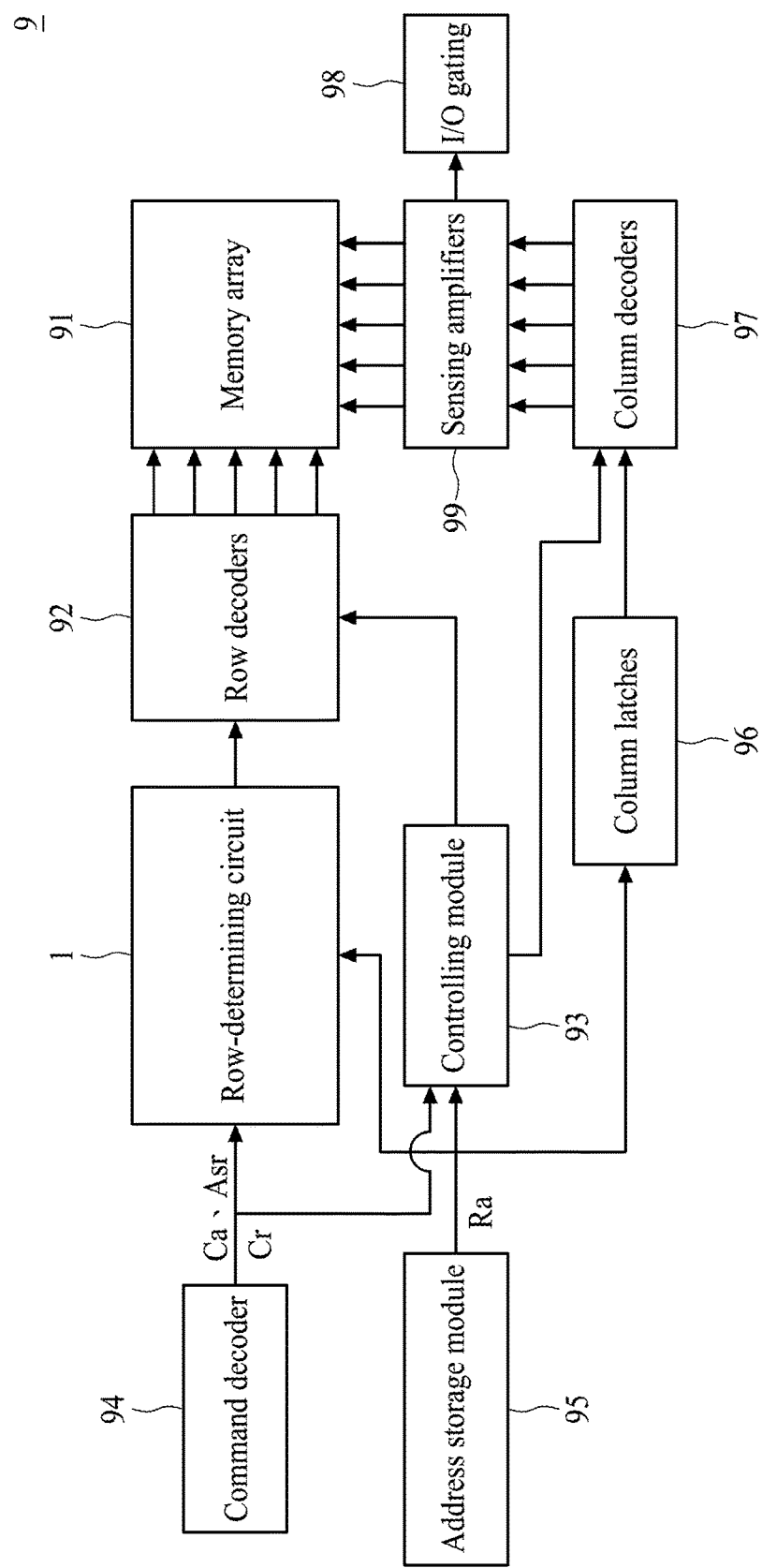
FIG. 1 is a block diagram of a DRAM in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of a DRAM 9 in accordance with some embodiments of the present disclosure. Referring to FIG. 1, in some embodiments, the DRAM 9 includes a memory array 91, a plurality of row decoders 92, a controlling module 93, a command decoder 94, an address storage module 95, a plurality of column latches 96, a plurality of column decoders 97, an I/O gating 98, a plurality of sensing amplifiers 99 and a row-determining circuit 1.

Figure 2A:
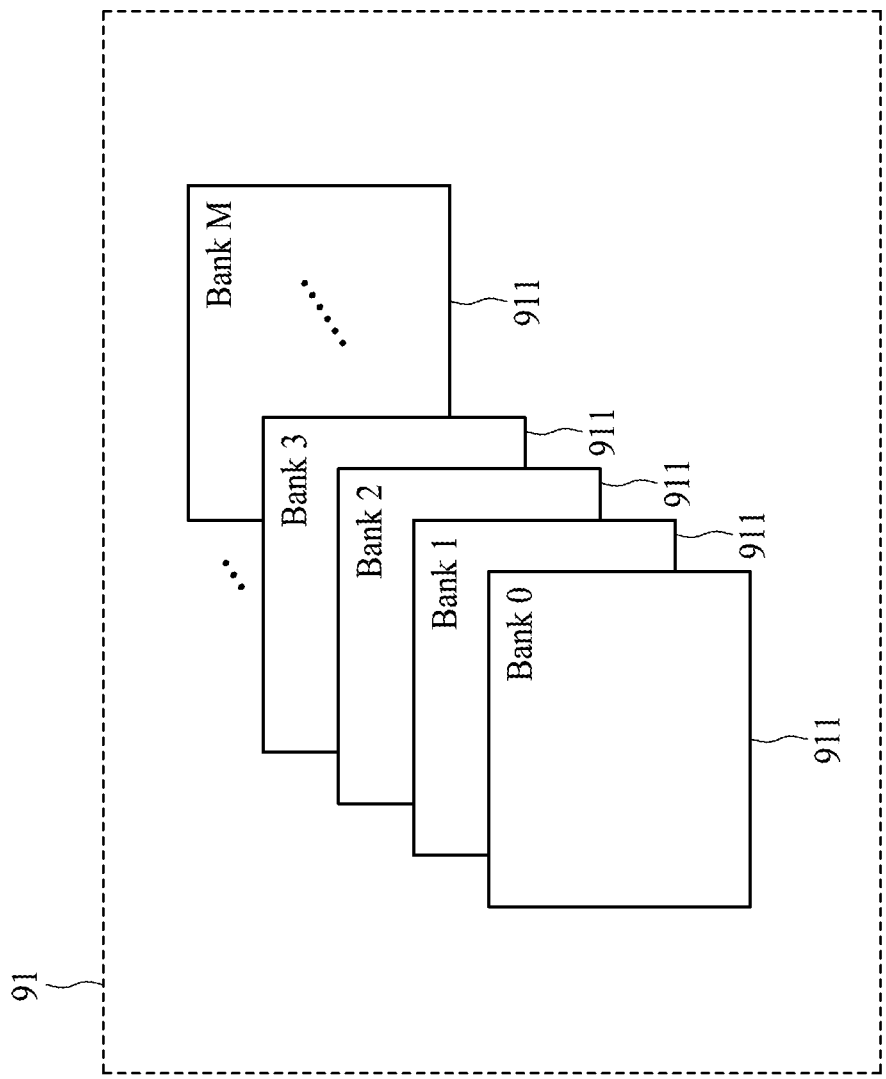
FIG. 2A is a schematic diagram illustrating a memory array of the DRAM in accordance with some embodiments of the present disclosure.
Figure 2B:
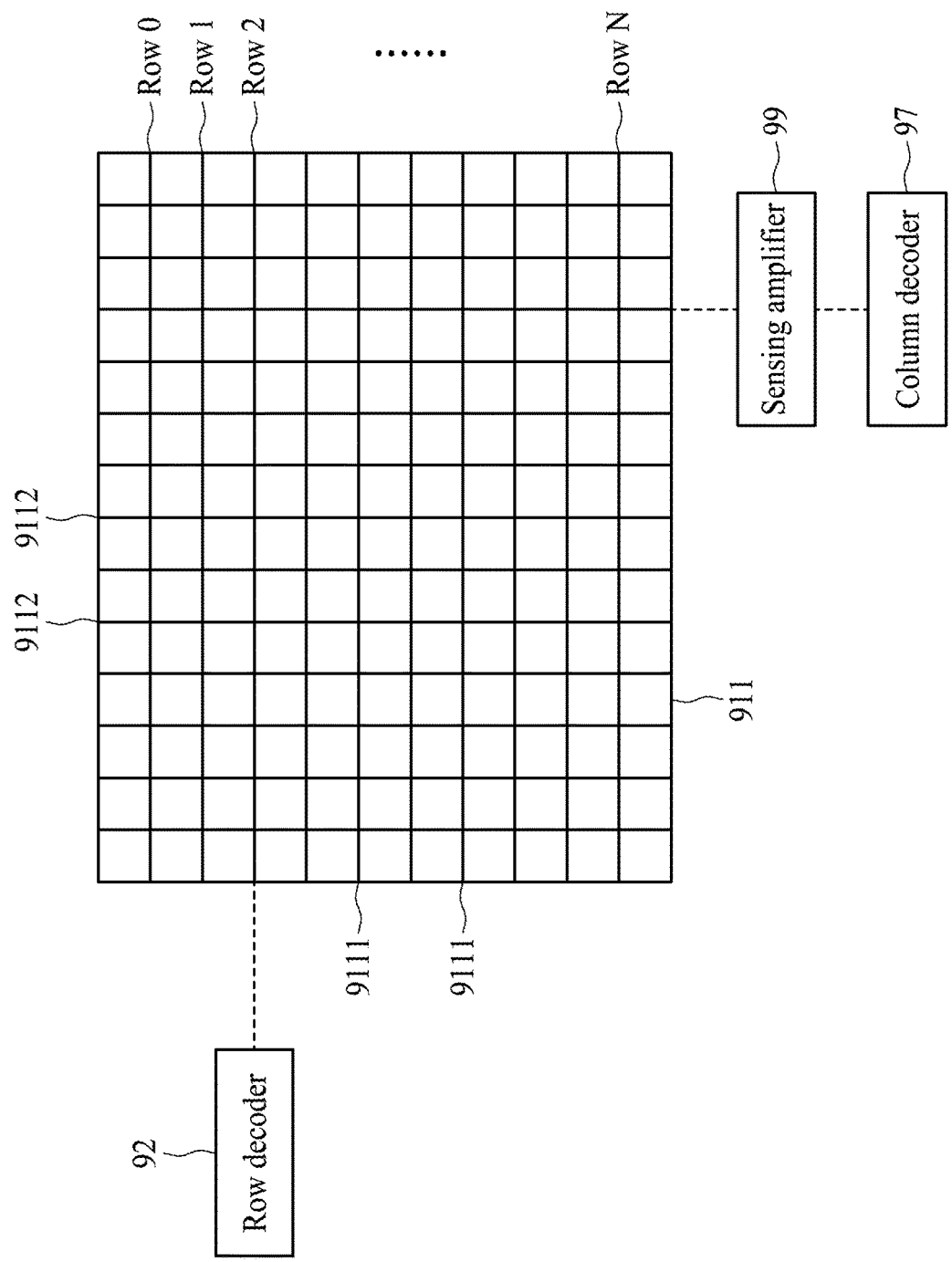
FIG. 2B is a schematic diagram illustrating a bank, of the memory array in accordance with some embodiments of the present disclosure.

FIG. 2A is a schematic diagram illustrating the memory array 91 of the DRAM 9 in accordance with some embodiments of the present disclosure, and FIG. 2B is a schematic diagram illustrating a bank 911 of the memory array 91 in accordance with some embodiments of the present disclosure. Referring to FIG. 2A, in some embodiments, the memory array 91 includes a plurality of banks 911, and the number of the plurality of banks 911 is defined as M. Referring to FIG. 2B, each of the plurality of banks 911 includes a plurality of rows 9111 and a plurality of columns 9112, and the number of the plurality of rows 9111 included in each of the plurality of banks 911 is defined as N. In other embodiments, the number of the plurality of banks 911 and the number of the plurality of rows 9111 included in each of the plurality of banks 911 may be varied.

Figure 2C:
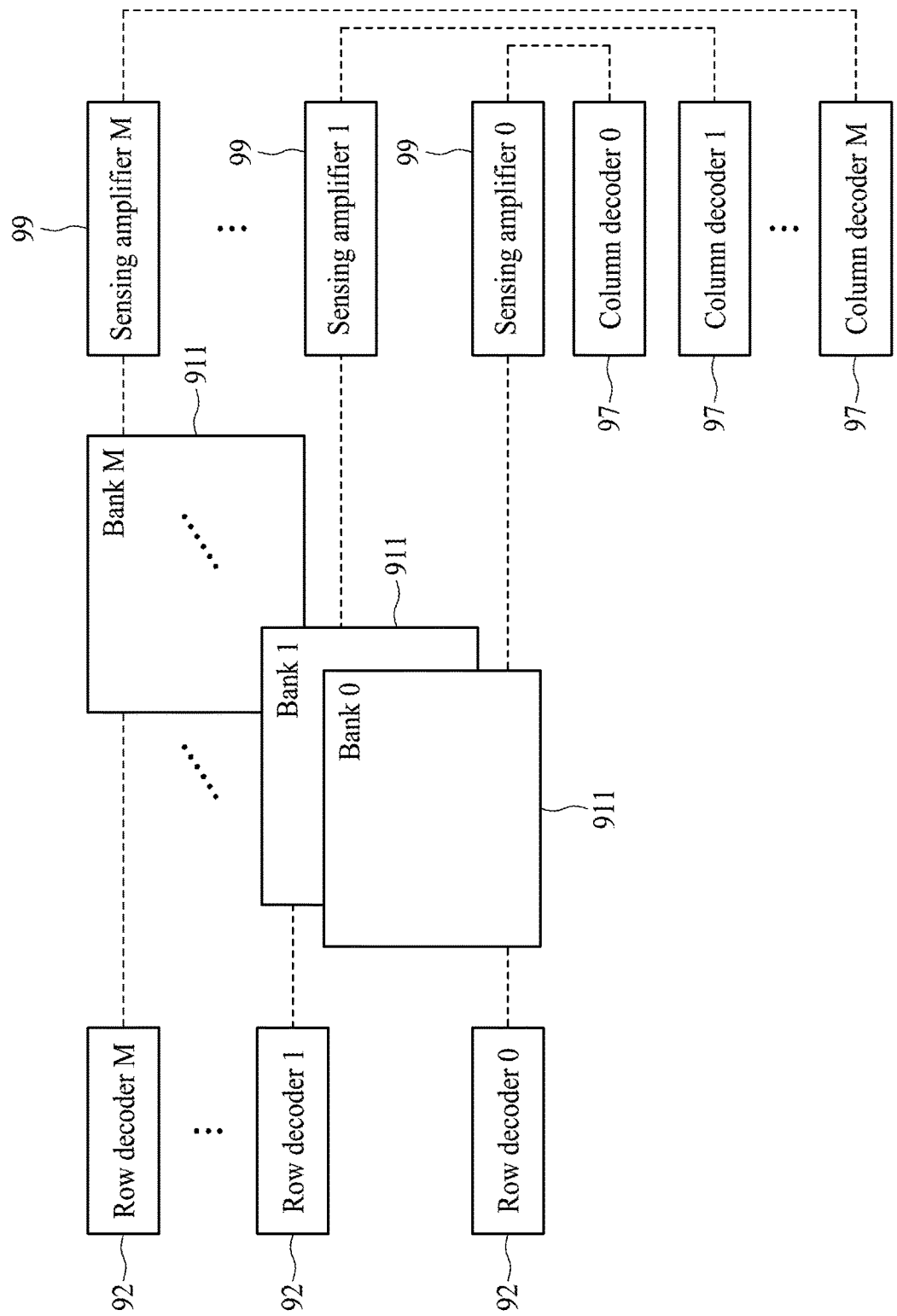
FIG. 2C is a schematic diagram illustrating a relationship between a plurality of banks and a plurality of row decoders, and a relationship between the plurality of banks and a plurality of column decoders, in accordance with some embodiments of the present disclosure.

FIG. 2C is a schematic diagram illustrating a relationship between the plurality of banks 911 and the plurality of row decoders 92, and a relationship between the plurality of banks 911 and the plurality of column decoders 97, in accordance with some embodiments of the present disclosure. Referring to FIG. 2C, in some embodiments, the plurality of row decoders 92 are respectively connected to the plurality of banks 911, and each of the plurality of row decoders 92 is configured to activate a row 9111 (see FIG. 2B) of a corresponding one of the plurality of banks 911. In some embodiments, the sensing amplifiers 99 are respectively connected to the plurality of banks 911. In some embodiments, the plurality of column decoders 97 are respectively connected to the plurality of sensing amplifiers 99, and each of the plurality of column decoders 97 is configured to activate a column 9112 (see FIG. 2B) of a corresponding one of the plurality of banks 911.

Referring back to FIG. 1, in some embodiments, the row-determining circuit 1 is connected to the plurality of row decoders 92 and is configured to determine which row 9111 (see FIG. 2B) of the corresponding one of the plurality of banks 911 (see FIG. 2A) is to be refreshed.

Referring to FIG. 1, in some embodiments, the controlling module 93 is connected to the plurality of row decoders 92 and the plurality of column decoders 97, and the controlling module 93 is configured to control operations of the plurality of row decoders 92 and the plurality of column decoders 97. The command decoder 94 is connected to the controlling module 93 and the row-determining circuit 1, and the command decoder 94 is configured to generate a refresh commend (Cr), an active command (Ca) and a stressed row address (Asr). The address storage module 95 is connected to the row-determining circuit 1, the controlling module 93 and the plurality of column latches 96, and the address storage module 95 is configured to generate a plurality of address records (Ra) for an auto-refreshing to process. In some embodiments, the plurality of column latches 96 are respectively connected to the plurality of column decoders 97. The I/O gating 98 is connected to the plurality of sensing amplifiers 99, and is configured to input or output a data.

Referring to FIG. 1, in some embodiments, the address storage module 95 and the column latches % are configured as registers, while the configurations of the address storage module 95 and the column latches 96 may be varied in other embodiments.

Figure 3:
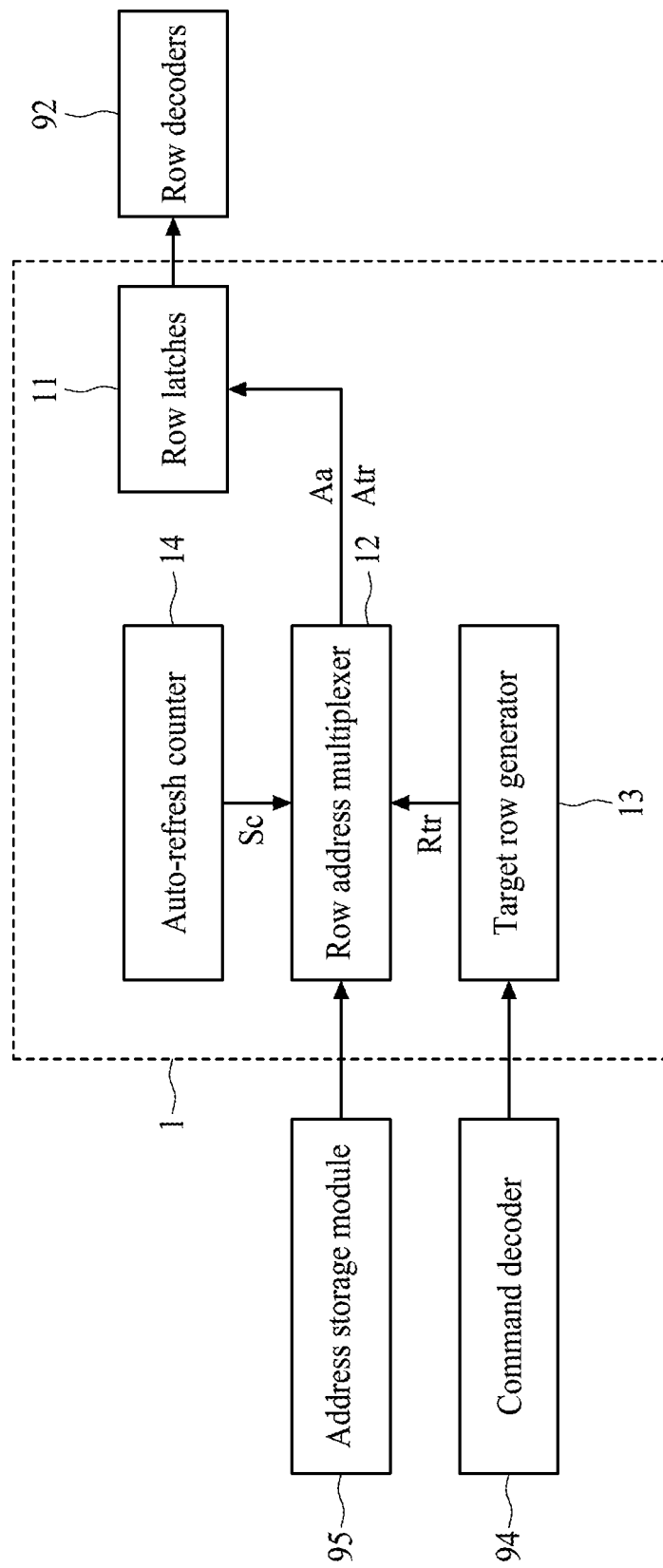
FIG. 3 is a block diagram illustrating a row-determining circuit of the DRAM in accordance with some embodiments of the present disclosure.

FIG. 3 is a block diagram illustrating the row-determining circuit 1 in accordance with some embodiments of the present disclosure. Referring to FIG. 3, in some embodiments, the row-determining circuit 1 includes a plurality of row latches 11, a row address multiplexer 12, a target row generator 13 and an auto-refresh counter 14. In some embodiments, the plurality of row latches 11 are respectively connected to the plurality of row decoders 92. In some embodiments, the row address multiplexer 12 is connected between the address storage module 95 and the plurality of row latches 11, and the row address multiplexer 12 is configured to generate an auto-refreshing row address (Aa) and a target row address (Atr). In some embodiments, the target row generator 13 is connected between the command decoder 94 and the row address multiplexer 12, and the target row generator 13 is configured to generate a target row record (Rtr). In some embodiments, the auto-refresh counter 14 is connected to the row address multiplexer 12 and is configured to generate a counting signal (Sc) to update the auto-refreshing row address (Aa).

Referring to FIG. 3, in some embodiments, the plurality of row latches 11 are configured as registers, while in other embodiments, the configurations of the plurality of row latches 11 may be varied.

Figure 4:
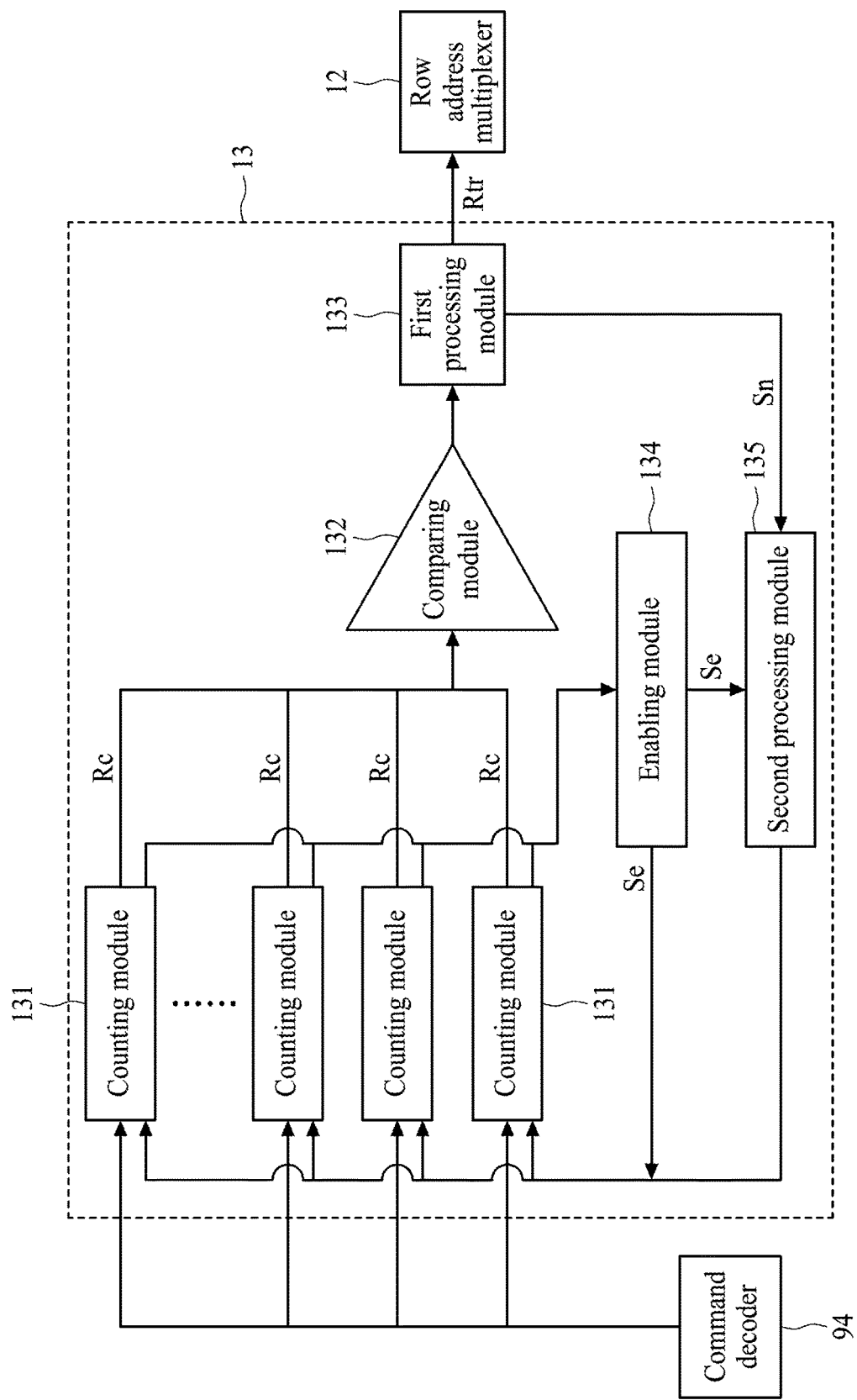
FIG. 4 is a block diagram illustrating a target row generator of the row-determining circuit in accordance with some embodiments of the present disclosure.

FIG. 4 is a block diagram illustrating the target row generator 13 in accordance with some embodiments of the present disclosure. Referring to FIG. 4, in some embodiments, the target row generator 13 includes a plurality of counting modules 131, a comparing module 132, a first processing module 133, an enabling module 134 and a second processing module 135.

In some embodiments, a row 9111 that suffers from a row hammer problem is regarded as a stressed row. Referring to FIG. 4, in some embodiments, the plurality of counting modules 131 are connected to the command decoder 94. Each of the plurality of counting modules 131 is configured to record a stressed degree of one of the plurality of rows 9111 (see FIG. 2B) of the plurality of banks 911 (see FIG. 2A), and to generate a counting record (Rc). In some embodiments, the stressed degree is correlated with a stressed time of the stressed row, and the stressed time is defined as the activated times of a row that is adjacent to the stressed row. In such a manner, the counting record (Rc) of each of the plurality of counting modules 131 is generated based on the stressed time of a corresponding one of the plurality of rows 9111.

Referring to FIG. 4, in some embodiments, the comparing module 132 is connected to the plurality of counting modules 131. In some embodiments, the comparing module 132 is configured to compare a plurality of counting records (Rc) generated by the plurality of counting modules 131, and to output two comparison records to the first processing module 133. In some embodiments, the number of the plurality of counting records (Rc) is less than the number of the plurality of rows 9111.

Referring to FIG. 4, in some embodiments, the first processing module 133 is connected between the comparing module 132 and the row address multiplexer 12. In some embodiments, the first processing module 133 is configured to generate the target row record (Rtr) based on one of the two comparison records from the comparing module 132. In some embodiments, the one of the two comparison records is generated from a counting record (Rc), which has a highest stressed time of the plurality of counting records (Rc), wherein the row 9111 that corresponds to the counting record (Rc) having the highest stressed time of the plurality of counting records (Rc) is defined as a target row. In some embodiments, the first processing module 133 is further configured to generate a numerical signal (Sn) based on the other one of the two comparison records from the comparing module 132. In some embodiments, the other one of the two comparison records is generated from a counting record (Rc) having a lower stressed degree (such as the lowest stressed time of the plurality of counting records (Rc). In some embodiments, the numerical signal (Sn) is generated for determining which of the plurality of counting modules 131 is to be reset.

Referring to FIG. 4, in some embodiments, the enabling module 134 is connected to the plurality of counting modules 131 and the second processing module 135, and the enabling module 134 is configured to generate an enable signal (Se) for the plurality of counting modules 131 and the second processing module 135 to actuate counting record-removing processes.

Referring to FIG. 4, in some embodiments, the second processing module 135 is connected to the first processing module 133, the plurality of counting modules 131 and the enabling module 134. In some embodiments, the second processing module 135 is configured to reset one of the plurality of counting modules 131 based on the numerical signal (Sn) generated by the first processing module 133.

Figure 5:
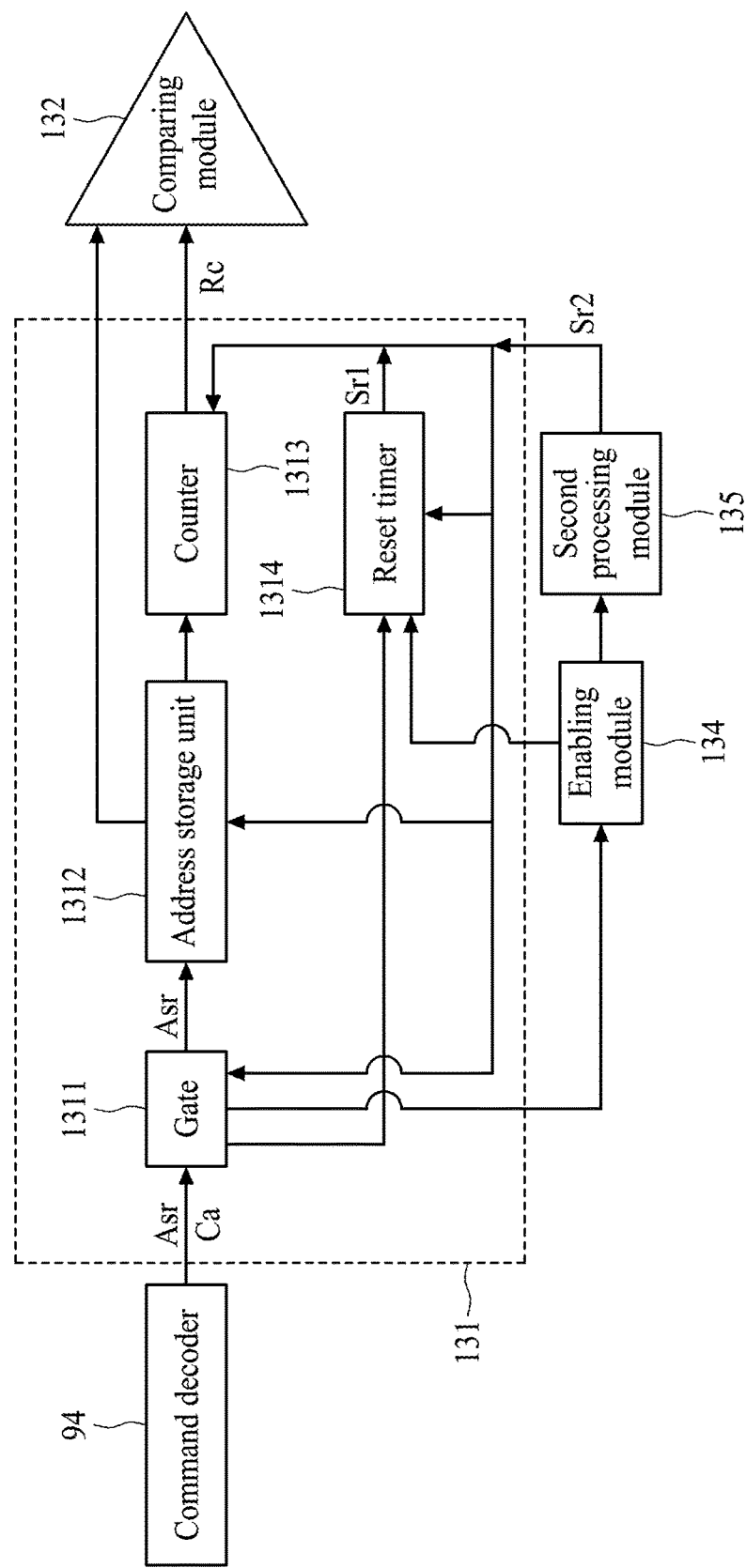
FIG. 5 is a block diagram illustrating a counting module of the target row generator in accordance with some embodiments of the present disclosure.

FIG. 5 is a block diagram illustrating the counting module 131 of the target row generator 13 in accordance with some embodiments of the present disclosure. Referring to FIG. 5, in some embodiments, each of the plurality of counting modules 131 includes a gate 1311, an address storage unit 1312, a counter 1313 and a reset timer 1314. In some embodiments, the gate 1311 is connected to the command decoder 94 and is configured to allow passage of the stressed row address (Asr) of the corresponding one of the plurality of rows 9111 (see FIG. 2B) based on the stressed row address (Asr). In some embodiments, the address storage unit 1312 is connected to the gate 1311 and the comparing module 132, and the address storage unit 1312 is configured to store the stressed row address (Asr) of the corresponding one of the plurality of rows 9111. In some embodiments, the counter 1313 is connected between the address storage unit 1312 and the comparing module 132, and the counter 1313 is configured to record the stressed time of the corresponding one of the plurality of rows 9111, and to generate the counting record (Rc). In some embodiments, the reset timer 1314 is connected to the gate 3111, the address storage unit 1312 and the counter 1313. In some embodiments, the reset timer 1314 is configured to generate a first reset signal (Sr1) to reset the gate 1311, the address storage unit 1312, the counter 1313, and the reset timer 1314 itself.

Referring to FIG. 5, in some embodiments, when the address storage unit 1312 of one of the plurality of counting modules 131 stores the stressed row address (Asr) of one of the plurality of rows 9111, the gate 1311 of a corresponding one of the plurality of counting modules 131 is regarded as an active gate. A detailed description of the active gate will be illustrated in the following paragraphs.

Referring to FIG. 5, in some embodiments, the gate 1311 of each of the plurality of counting modules 131 is configured as a transistor, while the configuration of the gate 1311 of each of the plurality of counting modules 131 may be varied.

Referring to FIG. 5, in some embodiments, the second processing module 135 is connected to the first processing module 133 (see FIG. 4), the enabling module 134, and the gate 1311, the address storage unit 1312, the counter 1313 and the reset timer 1314 of each of the plurality of counting modules 131. In some embodiments, the second processing module 135 is configured to generate a second reset signal (Sr2) to reset the gate 1311, the address storage unit 1312, the counter 1313 and the reset timer 1314 of one of the plurality of counting modules 131.

Figure 6:
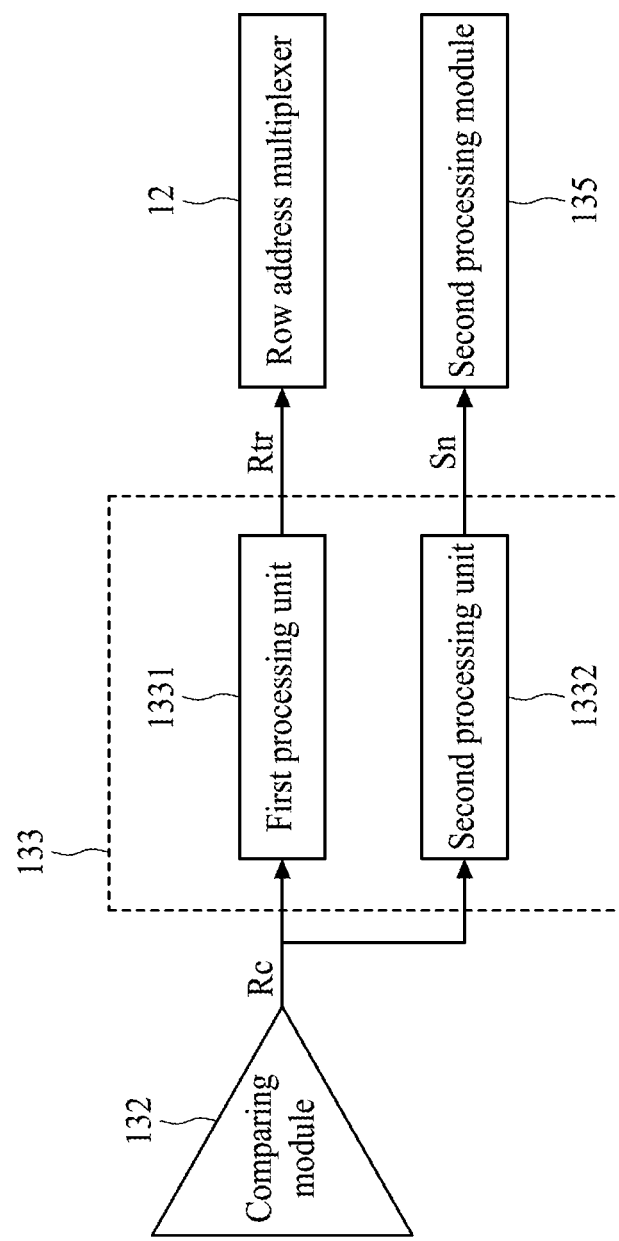
FIG. 6 is a block diagram illustrating a first processing module of the target row generator in accordance with some embodiments of the present disclosure.

FIG. 6 is a block diagram illustrating the first processing module 133 of the target row generator 13 in accordance with some embodiments of the present disclosure. Referring to FIG. 6, in some embodiments, the first processing module 133 includes a first processing unit 1331 and a second processing unit 1332. In some embodiments, the first processing unit 1331 is connected between the comparing module 132 and the row address multiplexer 12. In some embodiments, the first processing unit 1331 is configured to generate the target row record (Rtr). In some embodiments, the second processing unit 1332 is connected between the comparing module 132 and the second processing module 135. In some embodiments, the second processing unit 1332 is configured to generate the numerical signal (Sn).

Figure 7:
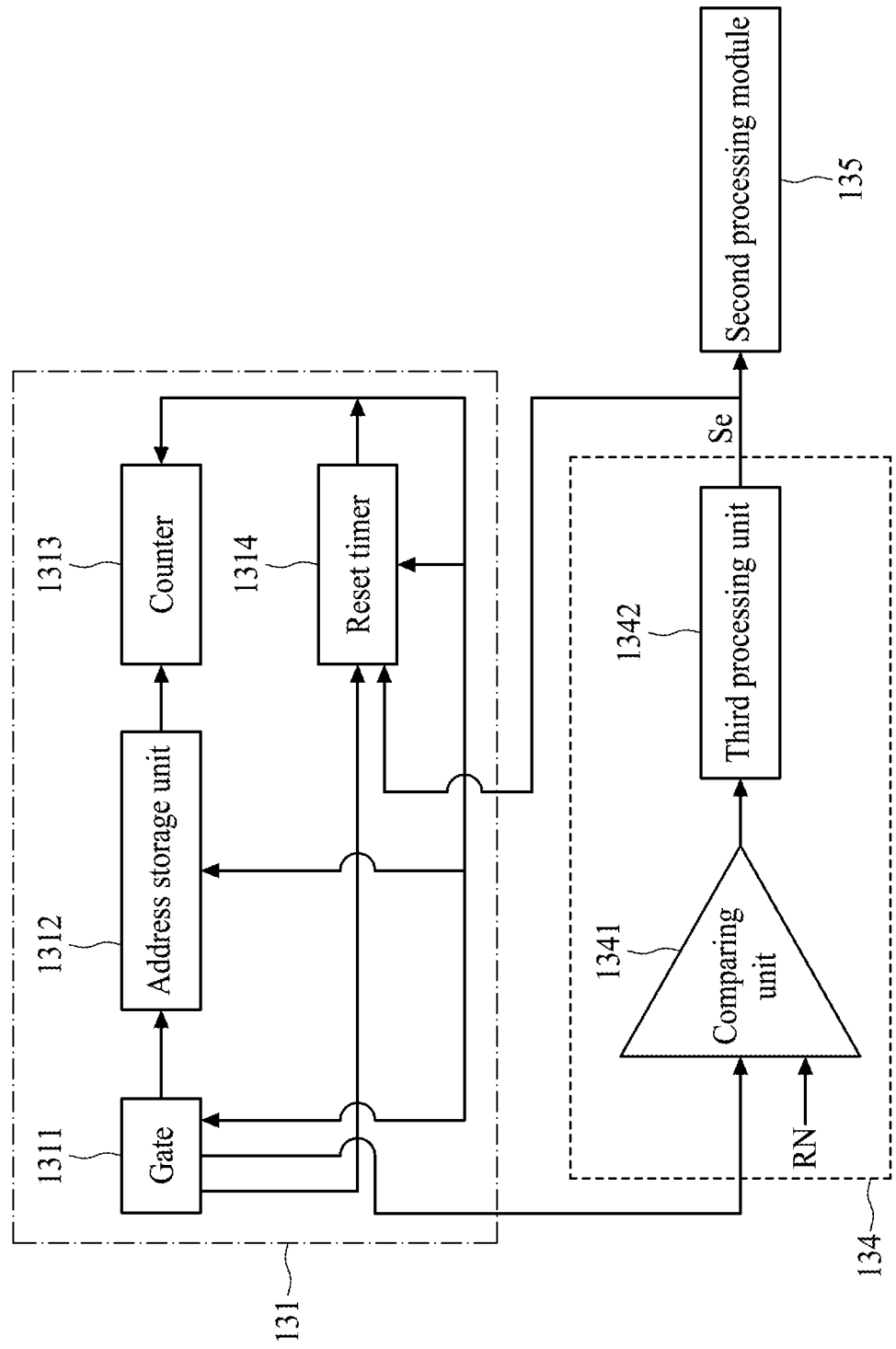
FIG. 7 is a block diagram illustrating an enabling module of the target row generator in accordance with some embodiments of the present disclosure.

FIG. 7 is a block diagram illustrating the enabling module 134 of the target row generator 13 in accordance with some embodiments of the present disclosure. Referring to FIG. 7, in some embodiments, the enabling module 134 is connected to the second processing module 135 and the gate 1311 and the reset timer 1314 of each of the plurality of counting modules 131. In some embodiments, the enabling module 134 includes a comparing unit 1341 and a third processing unit 1342. In some embodiments, the comparing unit 1341 is connected to the gate 1311 of each of the plurality of counting modules 131, and is configured to compare the number of a plurality of active gates with a reference number (RN). In some embodiments, the third processing unit 1342 is connected to the comparing unit 1341, the reset timer 1314 of each of the plurality of counting modules 131, and the second processing module 135. In some embodiments, the third processing unit 1342 is configured to generate the enable signal (Se) when the number of active gates is equal to the reference number (RN) based on the output of the comparing unit 1341.

Referring to FIG. 7, in some embodiments, the reference number (RN) is a given value and is the same as the number of the plurality of counting modules 131, such that when the number of the plurality of active gates is equal to the reference number (RN), it is indicated that the address storage unit 1312 of each of the plurality of counting modules 131 stores the stressed row address (Asr) of the corresponding one of the plurality of rows 9111, and that it is necessary to actuate reset processes for the subsequent counting process. In other embodiments, such configurations may be varied.

Figure 8:
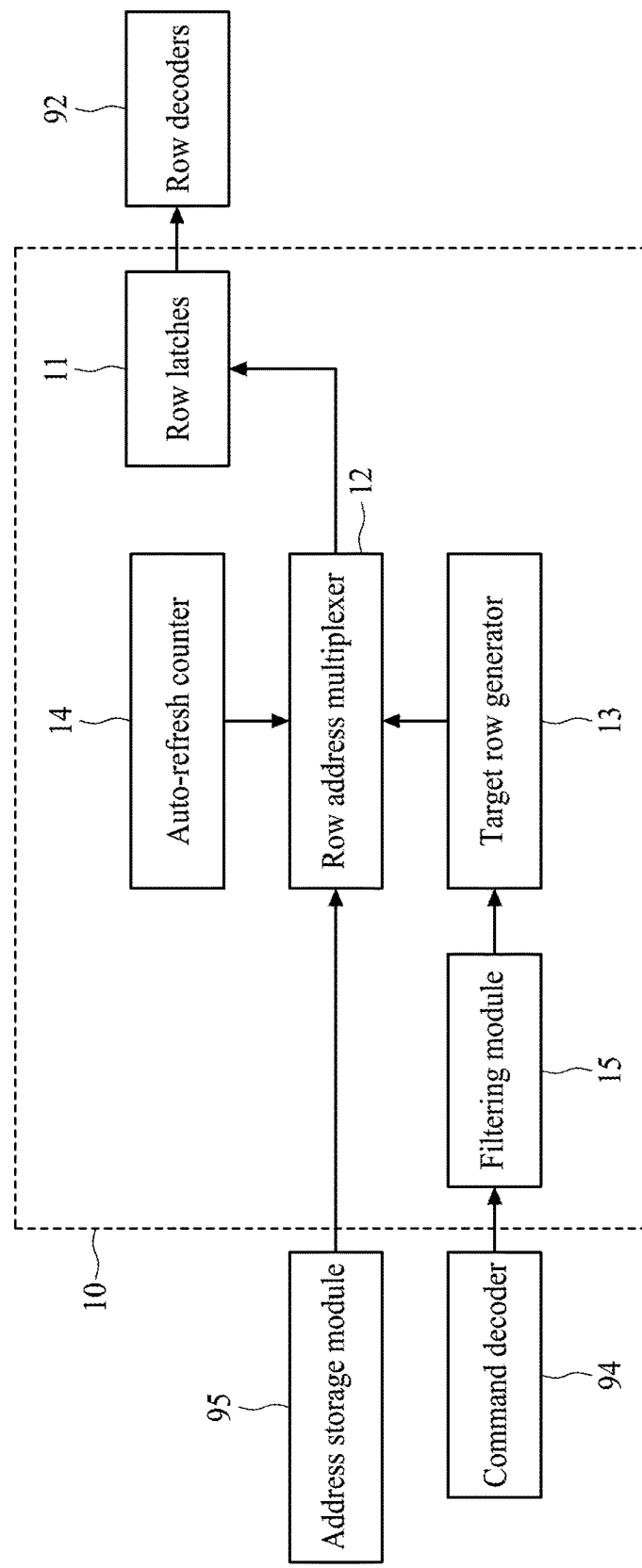
FIG. 8 is a block diagram illustrating the row-determining circuit of the DRAM in accordance with some embodiments of the present disclosure.

FIG. 8 is another block diagram illustrating the row-determining circuit 10 of the DRAM 9 in accordance with some embodiments of the present disclosure. Referring to FIG. 8, in some embodiments, the row-determining circuit 10 further includes a filtering module 15 connected between the command decoder 94 and the target row generator 13. In some embodiments, the filtering module 15 is configured to reduce a working burden of the target row generator 13.

Figure 9:
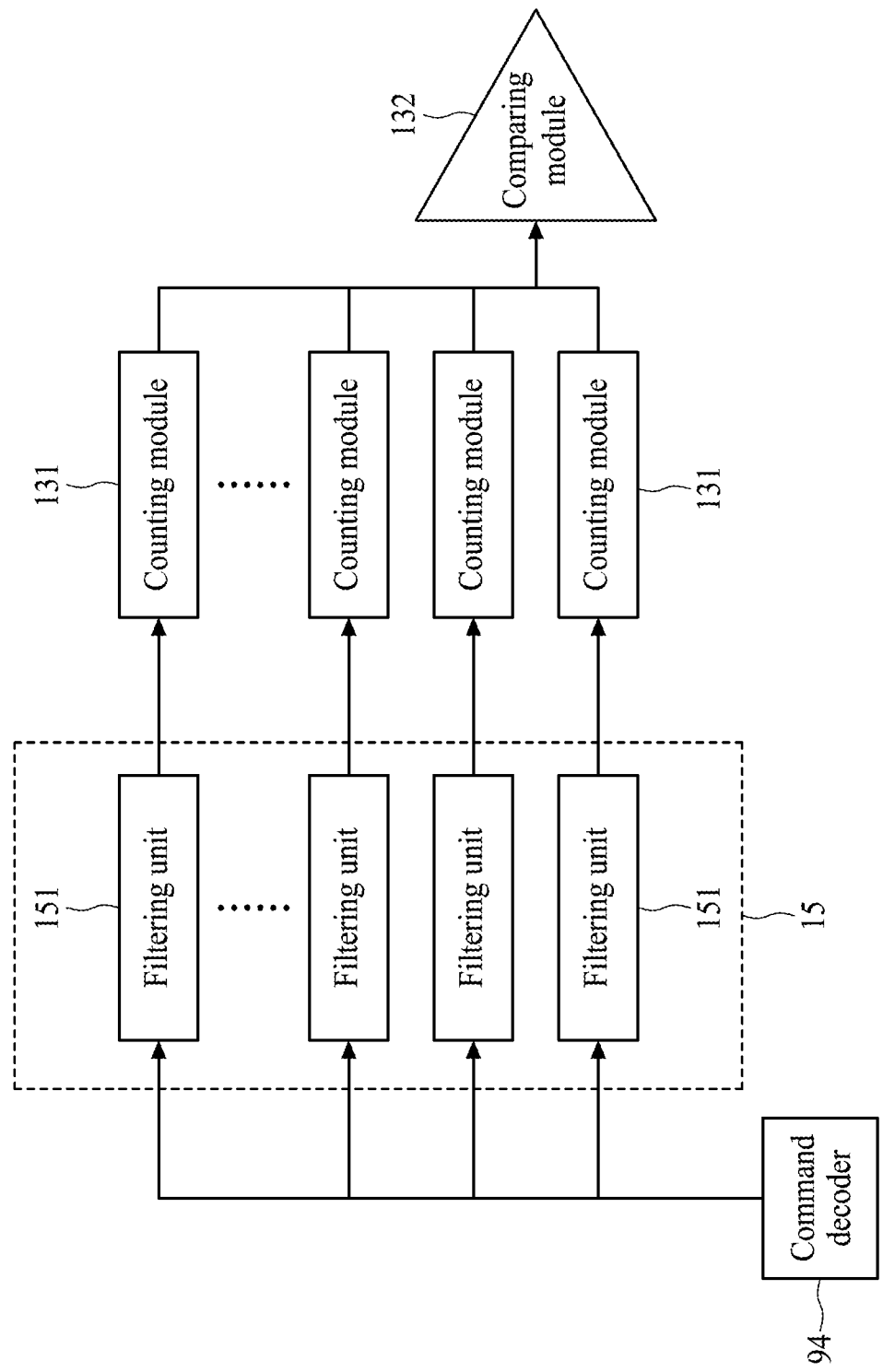
FIG. 9 is a block diagram illustrating a filtering module of the row-determining circuit of the DRAM in accordance with some embodiments of the present disclosure.

FIG. 9 is a block diagram illustrating the filtering module 15 in accordance with some embodiments of the present disclosure. Referring to FIG. 9, in some embodiments, the filtering module 15 includes a plurality of filtering units 151 respectively connected to the plurality of counting modules 131. In some embodiments, each of the filtering units 151 is configured to implement a filtering process, such that a working burden of a corresponding one of the plurality of counting modules 131 is reduced. During the filtering process, each of the plurality of filtering units 151 allows passage of only one of a plurality of active commands (Ca) and only one of a plurality of stressed row addresses (Asr) after receiving a preset quantity of the plurality of active commands (Ca) and a preset quantity of the plurality of stressed row addresses (Asr). In some embodiments, each of the filtering units 151 is configured as a linear feedback shift register (LFSR), while in other embodiments, such configuration may be varied.

Figure 10:
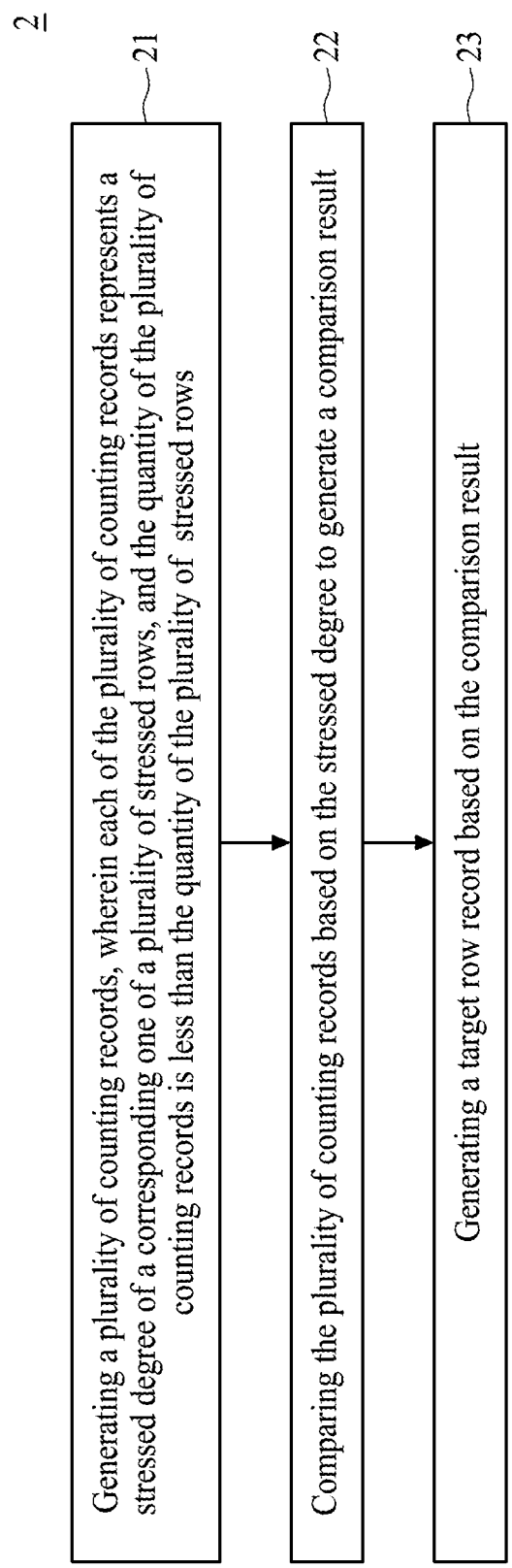
FIG. 10 is a flowchart illustrating a method for determining a target row in accordance with some embodiments of the present disclosure.

FIG. 10 is a flowchart illustrating a method 2 for determining the target row in accordance with some embodiments of the present disclosure. Referring to FIG. 10, in some embodiments, the method 2 includes a step 21, in which the plurality of counting records (Rc) are generated, wherein each of the plurality of counting records (Rc) represents the stressed time of a corresponding one of a plurality of stressed rows, and the quantity of the plurality of counting records (Rc) is less than the quantity of the plurality of stressed rows; a step 22, in which the plurality of counting records (Rc) are compared to select a counting record (Rc) from the plurality of counting records (Rc); a step 23, in which the target row record (Rtr) is generated, and the target row record (Rtr) is generated based on the counting record (Rc) selected from the plurality of counting records (Rc).

In some embodiments, a memory-array-refreshing process includes two sub-processes: the auto-refreshing process and a row-hammer-refreshing process. In some embodiments, during the memory-array-refreshing process, the DRAM 9 uses most of its operating time performing the auto-refreshing process, and uses the remaining time performing the row-hammer-refreshing process. In other embodiments, such configuration may be varied.

Referring back to FIG. 3, in some embodiments, during the auto-refreshing process, the auto-refresh counter 14 first generates the counting signal (Sc), and the counting signal (Sc) is sent to the row address multiplexer 12 to update the auto-refreshing row address (Aa). Next, the row address multiplexer 12 generates an updated auto-refreshing row address (Aa), and the updated auto-refreshing row address (Aa) is sent to the plurality of row decoders 92 through the plurality of row latches 21. Subsequently, each of the plurality of banks 911 (see FIG. 2A) is refreshed based on the updated auto-refreshing row address (Aa). For example, when the counting signal (Sc) indicates number one, a first row of each of the plurality of banks 911 is refreshed, and when the counting signal (Sc) is updated to indicate number two, a second row of each of the plurality of banks 911 is then refreshed.

Referring to FIG. 3, in some embodiments, during the row-hammer-refreshing process, the target row generator 13 first generates the target row record (Rtf). Next, the target row record (Rtr) is sent to the row address multiplexer 12, and the row address multiplexer 12 generates the target row address (Atr) based on the target row record (Rtr). Next, the target row address (Atr) is sent to the plurality of row decoders 92 through the plurality of row latches 11. Subsequently, each of the plurality of banks 911 (see FIG. 2A) is refreshed based on the target row address (Atr).

Referring to FIG. 4, in some embodiments, during a target-row-record generating process, the plurality of counting modules 131 first generate the plurality of counting records (Rc). Next, the plurality of counting records (Rc) are compared. Next, the counting record (Rc) having the highest stressed time is selected from the plurality of counting records (Rc). Subsequently, the target row record (Rtr) is generated from the counting record (Rc) having the highest stressed time of the plurality of counting records (Rc).

In some embodiments, the target-row-record generating process includes three sub-processes: a counting process, a first reset process and a second reset process, in some embodiments, the first reset process and the second reset process are simultaneously actuated, while in other embodiments, such configuration may be varied.

Figure 11:
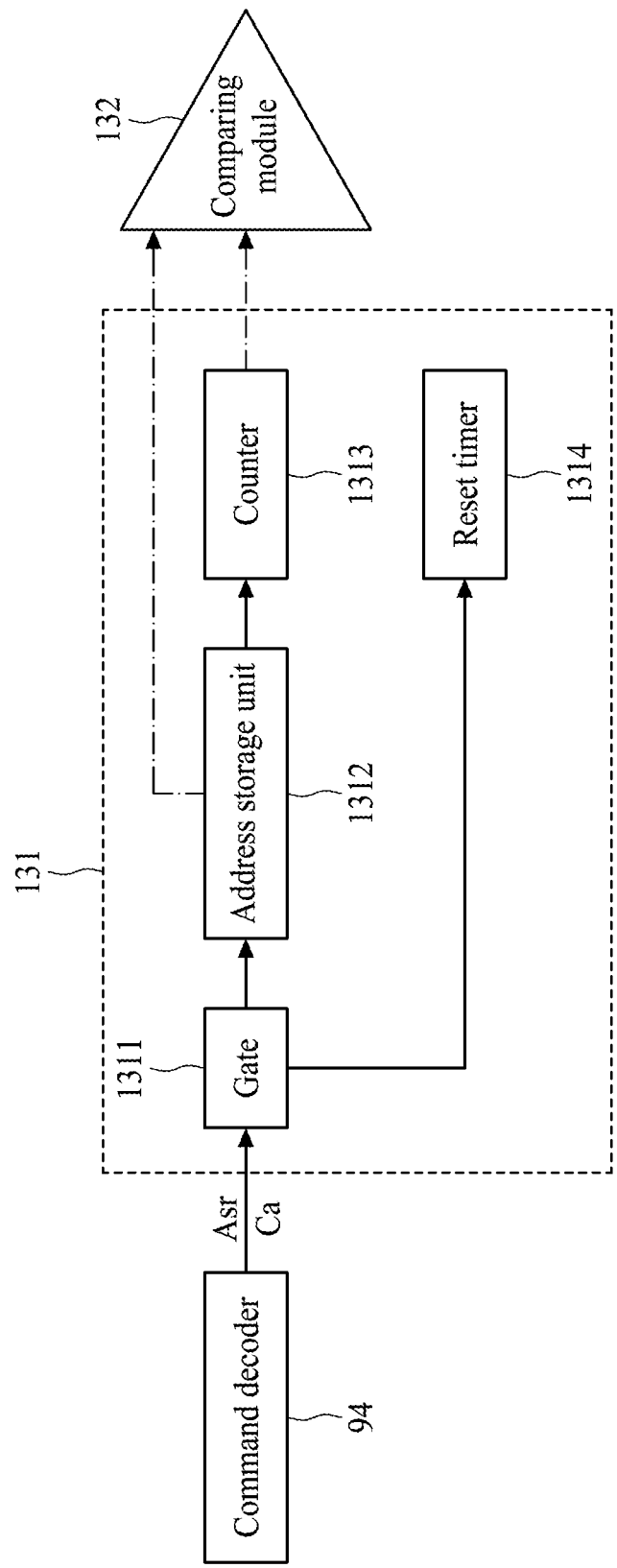
FIG. 11 is a schematic diagram illustrating a counting process of the counting module in accordance with some embodiments of the present disclosure.

FIG. 11 is a schematic diagram illustrating the counting process of the counting module 131 in accordance with some embodiments of the present disclosure. Referring to FIG. 11, in some embodiments, when the DRAM 9 (see FIG. 1) is not actuated, the plurality of counting modules 131 (see FIG. 4) do not record the stressed time of any one of the plurality of rows 9111 (see FIG. 2B). In some embodiments, after the DRAM 9 is actuated, when one of the plurality of rows 9111 is stressed, the command decoder 94 sends the active command (Ca) and the stressed row address (Asr) of the one of the plurality of rows 9111 to one of the plurality of counting modules 131. In some embodiments, since the one of the plurality of counting modules 131 does not record the stressed time of any one of the plurality of rows 9111, the gate 1311 of the one of the plurality of counting modules 131 first allows passage of the active command (Ca) and the stressed row address (Asr) of the one of the plurality of rows 9111; next, the stressed row address (Asr) of the one of the plurality of rows 9111 is stored by the address storage unit 1312 of the one of the plurality of counting modules 131, and the active command (Ca) is sent to the reset timer 1314 of the one of the plurality of counting modules 131 to restart the timing of the reset timer 1314; subsequently, the counter 1313 of the one of the plurality of counting modules 131 records one stressed time for the one of the plurality of rows 9111.

Referring to FIG. 11, in some embodiments, when the one of the plurality of rows 9111 (see FIG. 2B) is further stressed, the gate 1311 of the one of the plurality of counting modules 131 allows the passage of the active command (Ca) and the stressed row address (Asr) of the one of the plurality of rows; consequently, the counter 1313 of the one of the plurality of counting modules 1313 records another stressed time for the one of the plurality of rows 9111, and the timing of the reset timer 1314 of the one of the plurality of counting modules 131 is again restarted.

Referring to FIG. 11, in some embodiments, when another one of the plurality of rows 9111 (see FIG. 2B) is stressed, the gate 1311 of the one of the plurality of counting modules 131 prohibits the passage of the active command (Ca) and the stressed row address (Asr) of another one of the plurality of rows 9111; consequently, another one of the plurality of counting modules 131 that do not record the stressed time of any one of the plurality of rows 9111 allows the passage of the active command (Ca) and the stressed row address (Asr) of another one of the plurality of rows 9111.

Referring back to FIG. 7, in some embodiments, when the number of active gates is equal to the reference number (RN), such condition indicates that none of the plurality of counting modules 131 (see FIG. 4) is available to record the stressed time of one of the plurality of rows 9111 (see FIG. 2B) that has not been recorded; as a result, the enabling module 134 sends the enable signals (Se) to the reset timers 1314 (see FIG. 5) of all of the plurality of counting modules 131 to perform the first reset process, and sends the enable signals (Se) to the second processing module 135 to perform the second reset process.

Figure 12:
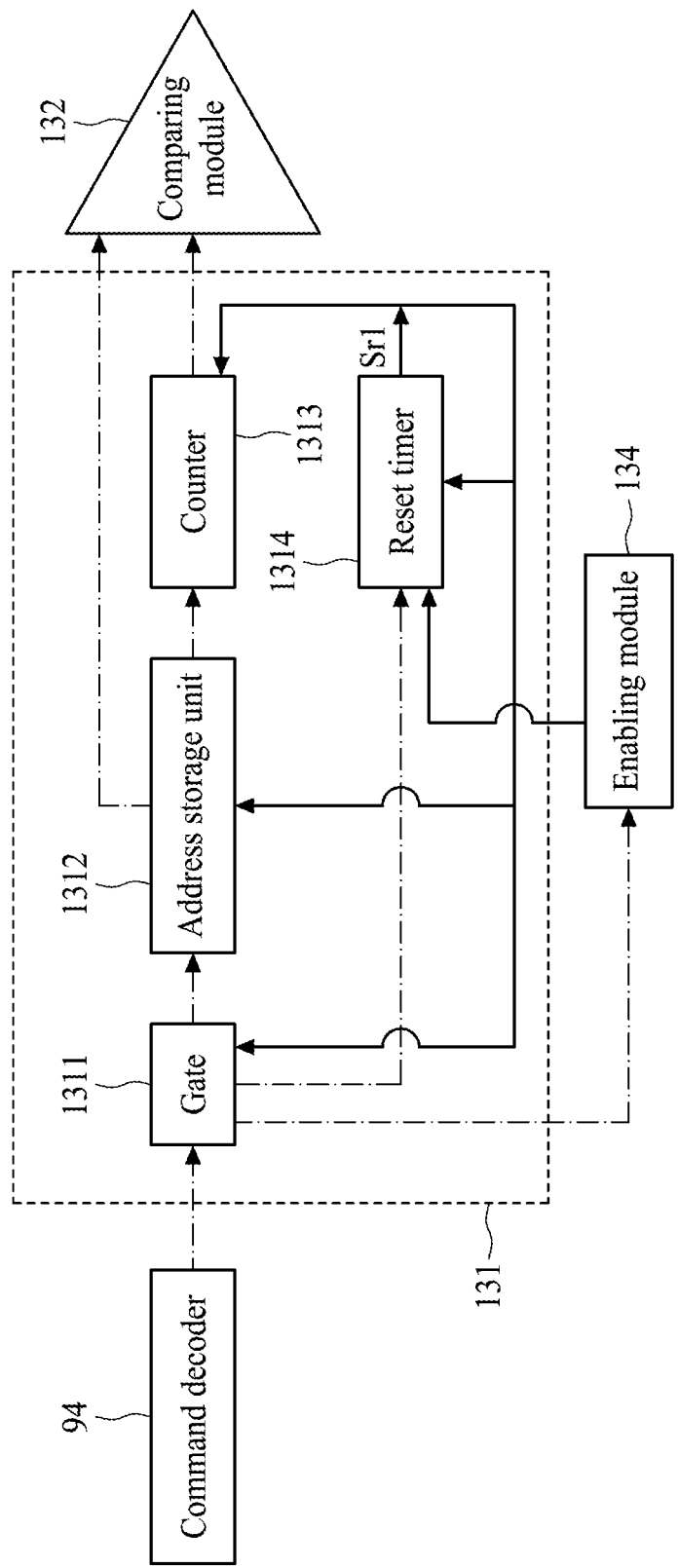
FIG. 12 is a schematic diagram illustrating a first reset process of the counting module in accordance with some embodiments of the present disclosure.

FIG. 12 is a schematic diagram illustrating the first reset process of the counting module 131 in accordance with some embodiments of the present disclosure. Referring to FIG. 12, in some embodiments, during the first reset process, the reset timer 1314 of each of the plurality of counting modules 131 sends the first reset signal (Sr1) to the gate 1311, the address storage unit 1312, the counter 1313, and the reset timer 1314 itself if the reset timer 1314 of a corresponding one of the plurality of counting modules 131 has not been restarted during the preset period of time. In some embodiments, when the reset timer 1314 of the corresponding one of the plurality of counting modules 131 has not been restarted during the preset period of time, such condition indicates that zero stressed times have been recorded during the preset period of time; consequently, the gate 1311, the address storage unit 1312, the counter 1313 and the reset timer 1314 of the corresponding one of the plurality of counting modules 131 are reset for the subsequent counting process.

Figure 13:
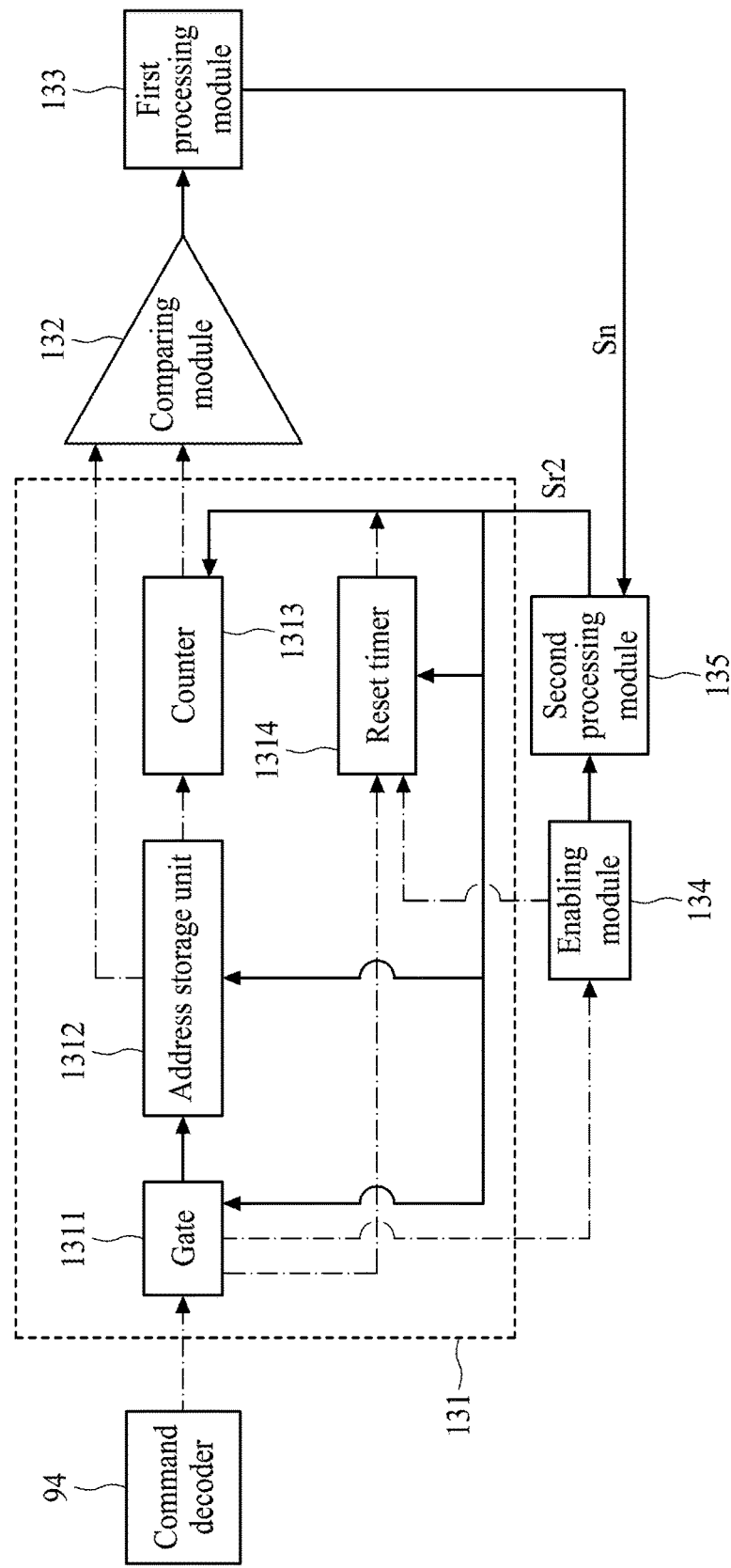
FIG. 13 is a schematic diagram illustrating a second reset process of the counting module in accordance with some embodiments of the present disclosure.

FIG. 13 is a schematic diagram illustrating the second reset process of the counting module 131 in accordance with some embodiments of the present disclosure. Referring to FIG. 13, in some embodiments, during the second reset process, the second processing module 135 sends the second reset signal (Sr2) to the gate 1311, the address storage unit 1312, the counter 1313 and the reset timer 1314 of a corresponding one of the plurality of counting modules 131 based on the numerical signal (Sn) from the first processing module 133; consequently, the gate 1311, the address storage unit 1312, the counter 1313 and the reset timer 1314 of the corresponding one of the plurality of counting modules 131 that has the counting record (Rc) having the lower stressed degree, such as the lowest stressed degree, are reset for the subsequent counting process.

Figure 14:
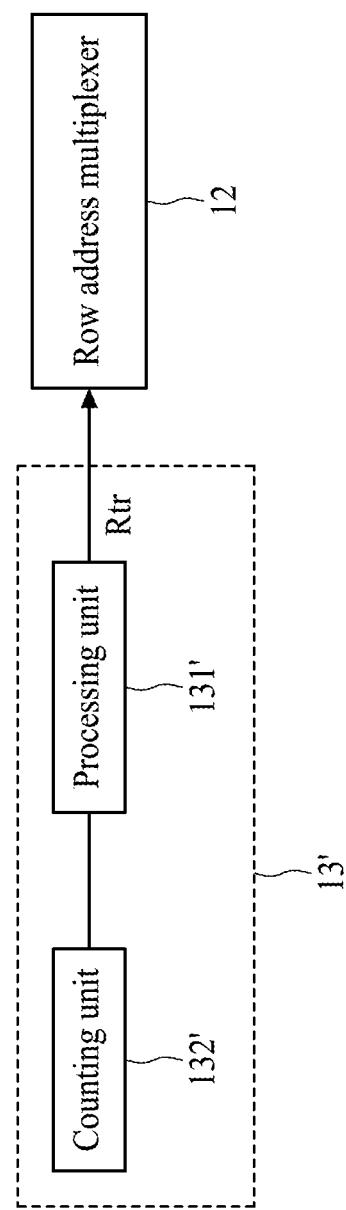
FIG. 14 is a block diagram illustrating a comparative target row generator.

FIG. 14 is a block diagram illustrating a comparative target row generator 13'. Referring to FIG. 14, the comparative target row generator 13' is connected to the row address multiplexer 12 and is configured to generate a target row record (Rtr). The comparative target row generator 13' includes a processing unit 131' and a counting unit 132'. The processing unit 131' is connected to the row address multiplexer 12 and is configured to generate the target row record (Rtr). The counting unit 132' is connected to the processing unit 131' and is configured to generate a plurality of target rows.

Figure 15:
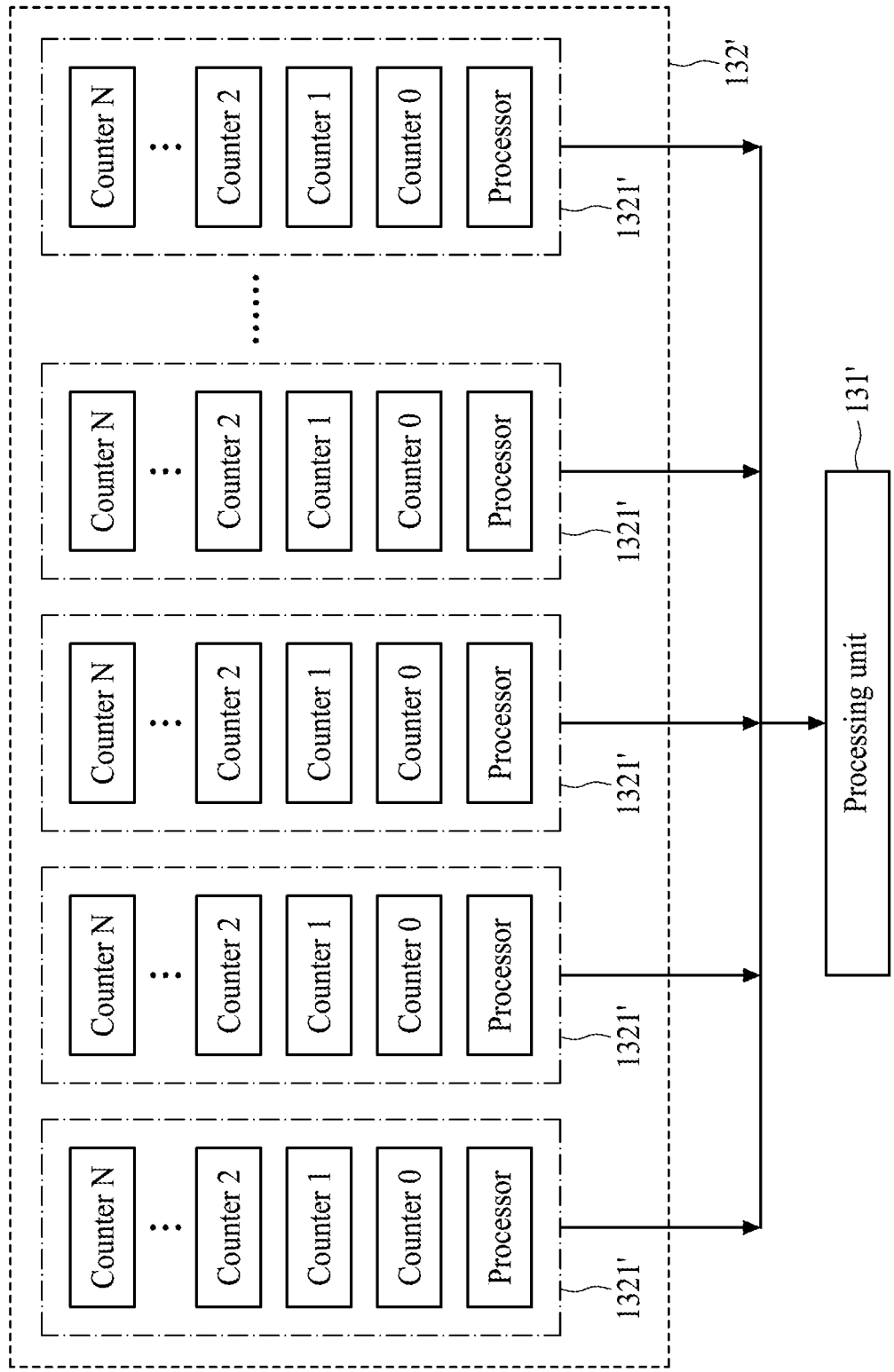
FIG. 15 is a block diagram illustrating a counting unit of the comparative target row generator.

FIG. 15 is a block diagram illustrating the counting unit 132' of the comparative target row generator 131'. Referring to FIG. 15, the counting unit 132' includes a plurality of counting blocks 1321' connected to the processing unit 131', and each of the plurality of counting blocks 1321' is configured to determine a target row. Each of the counting blocks 1321' includes a plurality of counters and a processor, and the number of the plurality of counters included in each of the plurality of counting blocks 1321' is the same as the number of the plurality of rows 9111 (see FIG. 2B) of each of the plurality of banks 911 (see FIG. 2A). The plurality of counters of each of the counting blocks 1321' are configured to respectively record the stressed times for the plurality of rows 9111. The processor of each of the counting blocks 1321' is configured to determine the target row. The number of the plurality of counting blocks 1321' is the same as the number of the plurality of banks 911.

Referring to FIG. 15, during a target-row-determining process of the comparative target row generator 13' (see FIG. 14), for each of the plurality of counting blocks 1321', if the number of the stressed time of one of the plurality of counters reaches a threshold value, the target row is determined to be the row which corresponds to the one of the plurality of counters. After each of the plurality of counting blocks 1321' determines the target row, the target row is sent to the processing unit 131'. Subsequently, the processing unit 131' generates the target row record (Rtr). Since the processing unit 131' only sends one target row record (Rtr) for all of the plurality of banks 911 (see FIG. 2A), the selection by the processing unit 131' of the target row from the plurality of counting blocks 1321' is based on the order of time priority. For example, when the third counting block 1321' determines and sends the target row to the processing unit 131' earlier than the other counting blocks 1321', the processing unit 131' then generates the target row record (Rtr) for all of the plurality of banks 911 based on the target row determined by the third counting block 1321'.

In the comparative target row generator 13', each of the plurality of rows 9111 of the plurality of banks 911 requires a counter to record the stressed time. Therefore, the comparative target row generator 13' includes a large number of counters. In contrast, the target row generator 13 of the present disclosure includes a limited number of counters to record the stressed time of a corresponding one of the plurality of rows 9111. Therefore, space occupied by the plurality of counters in the target row generator 13 is reduced. As a result, a size of the DRAM 9 can also be reduced correspondingly.

One aspect of the present disclosure provides a target row generator. In some embodiments, the target row generator includes a plurality of counting modules, a comparing module and a first processing module. Each of the plurality of counting modules is configured to generate a counting record. In some embodiments, the comparing module is connected to the plurality of counting modules and is configured to compare a plurality of counting records generated by the plurality of counting modules. In some embodiments, the first processing module is connected to the comparing module and is configured to generate a target row record based on a comparison result from the comparing module. In some embodiments, each of the plurality of counting records represents a stressed degree of a corresponding one of a plurality of stressed rows. In some embodiments, the quantity of the plurality of counting modules is less than the quantity of the plurality of stressed rows.

One aspect of the present disclosure provides a dynamic random access memory (DRAM). The DRAM includes a memory array with a plurality of banks, and a row-determining circuit connected to the memory array. Each of the plurality of banks includes a plurality of rows. In some embodiments, the row-determining circuit includes a target row generator configured to generate a target row record, and the target row generator includes a plurality of counting modules, a comparing module and a first processing module. Each of the plurality of counting modules is configured to generate a counting record. The comparing module is connected to the plurality of counting modules and is configured to compare a plurality of counting records generated by the plurality of counting modules. The first processing module is connected to the comparing module and is configured to generate the target row record based on a comparison result from the comparing module. In some embodiments, each of the plurality of counting records represents a stressed degree of a corresponding one of a plurality of stressed rows. In some embodiments, the quantity of the plurality of counting modules is less than the quantity of the plurality of stressed rows.

One aspect of the present disclosure provides a method for determining a target row. The method includes the following steps. A plurality of counting records are generated, wherein each of the plurality of counting records represents a stressed degree of a corresponding one of a plurality of stressed rows, and the quantity of the plurality of counting records is less than the quantity of the plurality of stressed rows. The plurality of counting records are compared based on the stressed degree to generate a comparison result. A target row record is generated based on the comparison result.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A target row generator, comprising:
   a plurality of counting modules, wherein each of the plurality of counting modules is configured to generate a counting record;
   a comparing module connected to the plurality of counting modules and configured to compare a plurality of counting records generated by the plurality of counting modules; and
   a first processing module connected to the comparing module and configured to generate a target row record based on a comparison result from the comparing module;
   wherein each of the plurality of counting records represents a stressed degree of a corresponding one of a plurality of stressed rows; and
   wherein the quantity of the plurality of counting modules is less than the quantity of the plurality of stressed rows.

2. The target row generator of claim 1, wherein each of the plurality of counting modules is configured to record the stressed degree of one of a plurality of rows, and the counting record of each of the plurality of counting modules is generated based on the stressed degree of a corresponding one of the plurality of rows.

3. The target row generator of claim 2, wherein each of the plurality of counting modules includes:
   a gate configured to allow passage of a stressed row address of the corresponding one of the plurality of rows;
   an address storage unit connected to the gate and configured to store the stressed row address of the corresponding one of the plurality of rows; and
   a counter connected between the address storage unit and the comparing module, wherein the counter is configured to record the stressed degree of the corresponding one of the plurality of rows, and to generate the counting record.

4. The target row generator of claim 3, wherein each of the plurality of counting modules further includes a reset timer connected to the gate, the address storage unit and the counter, wherein the reset timer is configured to generate a reset signal to reset the gate, the address storage unit, the counter and the reset timer.

5. The target row generator of claim 1, further comprising an enabling module connected to the plurality of counting modules and configured to generate an enable signal.

6. The target row generator of claim 5, further comprising a second processing module connected to the first processing module, the enabling module and the plurality of counting modules, wherein the second processing module is configured to generate a reset signal to reset one of the plurality of counting modules.

7. A dynamic random access memory (DRAM), comprising:
   a memory array including a plurality of banks, wherein each of the plurality of banks includes a plurality of rows; and
   a row-determining circuit connected to the memory array;
   wherein the row-determining circuit includes a target row generator configured to generate a target row record, and the target row generator includes:
   a plurality of counting modules, wherein each of the plurality of counting modules is configured to generate a counting record;
   a comparing module connected to the plurality of counting modules and configured to compare a plurality of counting records generated by the plurality of counting modules; and
   a first processing module connected to the comparing module and configured to generate the target row record based on a comparison result from the comparing module; and
   wherein each of the plurality of counting records represents a stressed degree of a corresponding one of a plurality of stressed rows; and wherein the quantity of the plurality of counting modules is less than the quantity of the plurality of stressed rows.

8. The DRAM of claim 7, wherein each of the plurality of counting modules is configured to record a stressed degree of one of the plurality of rows, and the counting record of each of the plurality of counting modules is generated based on the stressed degree of a corresponding one of the plurality of rows.

9. The DRAM of claim 8, wherein each of the plurality of counting modules includes:
   a gate configured to allow passage of a stressed row address of the corresponding one of the plurality of rows;
   an address storage unit connected to the gate and configured to store the stressed row address of the corresponding one of the plurality of rows; and
   a counter connected between the address storage unit and the comparing module, wherein the counter is configured to record the stressed degree of the corresponding one of the plurality of rows, and to generate the counting record.

10. The DRAM of claim 9, wherein each of the plurality of counting modules further includes a reset timer connected to the gate, the address storage unit and the counter, and the reset timer is configured to generate a reset signal to reset the gate, the address storage unit, the counter, and the reset timer itself.

11. The DRAM of claim 7, wherein the target row generator further includes an enabling module connected to the plurality of counting modules and configured to generate an enable signal.

12. The DRAM of claim 11, wherein the target row generator further includes a second processing module connected to the first processing module, the enabling module and the plurality of counting modules, and the second processing module is configured to generate a reset signal to reset one of the plurality of counting modules.

13. The DRAM of claim 10, further comprising a command decoder connected to the plurality of counting modules and configured to generate an active command and the stressed row address for each of the plurality of counting modules.

14. The DRAM of claim 13, wherein the command decoder is connected to the gate of each of the plurality of counting modules.

15. The DRAM of claim 7, wherein the row-determining circuit further includes a row address multiplexer connected to the first processing module of the target row generator and configured to generate a row address record.

16. A method for determining a target row, comprising steps of:
   generating a plurality of counting records, wherein each of the plurality of counting records represents a stressed degree of a corresponding one of a plurality of stressed rows, and the quantity of the plurality of counting records is less than the quantity of the plurality of stressed rows;
   comparing the plurality of counting records based on the stressed degree to generate a comparison result; and
   generating a target row record based on the comparison result.

17. The method of claim 16, further a step of comprising removing one of the plurality of counting records, wherein the one of the plurality of counting records has a lower stressed degree.

18. The method of claim 17, wherein the step of removing one of the plurality of counting records is performed if the number of the plurality of counting records is equal to a reference number.

19. The method of claim 16, further comprising removing one of the plurality of counting records, wherein the one of the plurality of counting records remains zero during a preset period of time.

20. The method of claim 19, wherein the step of removing one of the plurality of counting records is performed if the number of the plurality of counting records is equal to a reference number.

* * * * *